(12) United States Patent
Walsh et al.

(10) Patent No.: US 6,686,283 B1
(45) Date of Patent: Feb. 3, 2004

(54) SHALLOW TRENCH ISOLATION PLANARIZATION USING SELF ALIGNED ISOTROPIC ETCH

(75) Inventors: Shawn T. Walsh, Richardson, TX (US); John E. Campbell, Plano, TX (US); Somit Joshi, Dallas, TX (US); James B. Friedmann, Dallas, TX (US); Michael J. McGranaghan, Dallas, TX (US); Janice D. Makos, McKinney, TX (US); Arun Sivasothy, Dallas, TX (US); Troy A. Yocum, Plano, TX (US); Jaideep Mavoori, Richardson, TX (US); Wayne A. Bather, Plano, TX (US); Joe G. Tran, Irving, TX (US); Ju-Ai Ruan, Plano, TX (US); Michelle L. Hartsell, Plano, TX (US); Gregory B. Shinn, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/498,083

(22) Filed: Feb. 4, 2000

Related U.S. Application Data

(60) Provisional application No. 60/118,861, filed on Feb. 5, 1999.

(51) Int. Cl.[7] .............................................. H01L 21/76
(52) U.S. Cl. ...................... 438/690; 438/691; 438/692
(58) Field of Search ................................. 438/690, 691, 438/692

(56) References Cited

U.S. PATENT DOCUMENTS

| | | | | |
|---|---|---|---|---|
| 5,668,043 A | * | 9/1997 | Park | 437/61 |
| 5,683,945 A | * | 11/1997 | Penner et al. | 437/225 |
| 5,777,370 A | * | 7/1998 | Omid-Zohoor et al. | 257/374 |
| 5,801,082 A | * | 9/1998 | Tseng | 438/424 |
| 5,895,254 A | * | 4/1999 | Huang et al. | 438/424 |
| 5,977,579 A | * | 11/1999 | Noble | 257/302 |
| 6,008,109 A | * | 12/1999 | Fulford, Jr. et al. | 438/437 |

* cited by examiner

Primary Examiner—Felisa Hiteshew
(74) Attorney, Agent, or Firm—Peter K. McLarty; W. James Brady, III; Frederick J. Telecky, Jr.

(57) ABSTRACT

A method for forming planar isolation structures for integrated circuits. A etch barrier is formed over the isolation fill material and an etch back is performed to remove material above unetched portions of the substrate. The exposed fill material is etched and planarized to form a planar isolation structure.

34 Claims, 2 Drawing Sheets

SHALLOW TRENCH ISOLATION PLANARIZATION USING SELF ALIGNED ISOTROPIC ETCH

This application claims priority under 35 USC § 119(e)(1) of provisional U.S. application Ser. No. 60/118,861 filed Feb. 5, 1999.

FIELD OF THE INVENTION

The invention is generally related to the field of semiconductor device fabrication and more specifically to a method for planarization of isolation structures in integrated circuits.

BACKGROUND OF THE INVENTION

Chemical-mechanical polishing (CMP) is utilized to planarize the oxide or other material used to fill shallow trenches formed for isolation. The most common approach used for CMP in semiconductor device fabrication is to attach a semiconductor wafer to a carrier (which may or may not rotate) via a mounting pad and polish the exposed surface of the wafer by bringing it into contact with a polishing pad (which is mounted on a rotating or non-rotating platen). The mechanical abrasion between the wafer surface and the polishing pad results in the polishing of the wafer surface. To aid in the polishing and the removal of any particles liberated in this process a slurry can be introduced between the wafer surface and the polishing pad. The slurry will interact with the wafer surface thereby making the wafer more easily polishable and the excess slurry will carry away the materials liberated from the wafer during this polishing step.

To achieve proper isolation between devices in integrated circuits a technique known as Shallow Trench Isolation (STI) is used. In this technique a shallow trench is formed in the silicon surface which is subsequently filled with an insulating material consisting usually of a deposited oxide. This deposited oxide is conformal and will follow the contours of the silicon surface resulting in an oxide film of equal thickness both in the trench and on the silicon surface where the devices are to be fabricated.

In order to achieve a planar surface for subsequent device fabrication, CMP is usually employed to remove to oxide that had formed over the silicon surfaces which will contain devices while leaving the oxide in the trench. These silicon surfaces are distributed non-uniformly across the integrated circuit requiring a process that can accommodate the range of integrated circuit densities and produce a uniform planar surface. This non-uniform distribution of silicon surfaces across an integrated circuit and the typical low selectivities (oxide to nitride) of most CMP silica slurries used for oxide polishing can result in significant dishing in areas that contain large trenches, damage to small isolated silicon surfaces, and incomplete removal of oxide from large silicon areas or arrays. Dummy silicon surfaces can be used to lessen these variations but the across-the-wafer and within-die-fill oxide thickness variations are still very high. Typically, to overcome this variation, a patterned etchback is used to decrease the apparent pattern density by etching back the oxide over the silicon surface leaving only extraneous oxide around the edge of the silicon surface that is readily removed using CMP with a short duration polish. This approach adds significant cost to producing the integrated circuit through the addition of a photolithography patterning level. Hence a method is needed that overcomes the limitations of CMP for STI planarization without the increased cost and complexity of the patterned etchback.

This invention provides a method that does not require a patterning step, and can accommodate arbitrary circuit densities.

SUMMARY OF THE INVENTION

The instant invention involves a method of forming planar isolation structures for use in integrated circuits.

An embodiment of the instant invention is a method of forming isolation structures in a semiconductor substrate comprising the steps of: etching trenches in said substrate, thereby forming substantially unetched areas of said substrate between said trenches; depositing a fill material that substantially fills said trenches, said fill material having an upper surface; forming a etch barrier on said upper surface of said fill material; removing portions of said etch barrier situated over said substantially unetched areas of said substrate thereby exposing portions of said fill material; removing said exposed portions of said fill material; and planarizing said fill material. Preferably the step of removing said etch barrier using a selective etch process, whereby said selective etch process has a etch barrier etch rate that is greater than a fill material etch rate.

An advantage of the instant invention is forming a planar isolation structure for arbitrary circuit densities using a reduced number of steps.

This and other advantages will be apparent to those of ordinary skill in the art having reference to the specification in conjunction with the drawings.

DETAILED DESCRIPTION OF THE INVENTION

The invention will now be described with reference to FIG. 1, FIGS. 2A–2E, and FIG. 3. It will be apparent to those of ordinary skill in the art that the benefits of the invention can be applied to other structures where planarization of a film is required.

Figure 1:
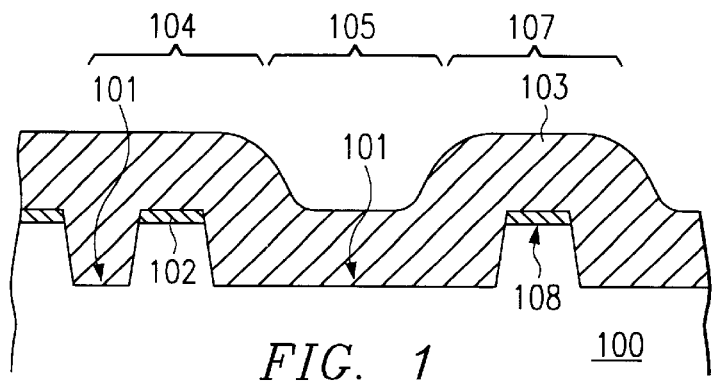
FIG. 1 is a cross-sectional diagram of a silicon wafer showing the shallow trench and trench fill oxide structures.

A silicon substrate 100 may be single-crystal silicon or an epitaxial silicon layer formed on a single crystal substrate with a number of trenches 101 is shown in FIG. 1. A nitride film 102 is formed and patterned and the silicon is etched to form the trenches 101. The nitride also serves to protect the unetched silicon surface 108 where devices will be fabricated. A conformal insulating fill material 103 is formed to fill the trenches and provide insulation between any devices subsequently fabricated on the unetched silicon surface 108. This conformal insulating fill material 103 could be a chemical vapor deposited (CVD) silicon oxide, PECVD TEOS, HDP Oxide, oxynitride or any insulating material with similar properties. The conformal nature of the fill material 103 results in the topography shown in FIG. 1. The fill material 103 will fill the trenches 105 (typically around 0.3–0.6 um deep) but will also form above the unetched silicon surface 108 with the same film thickness as that in the trench 105. In areas with closely spaced unetched silicon surfaces 104, the fill material will form a relatively flat surface across both silicon surfaces. In areas with isolated unetched silicon surfaces 107, the fill material 103 will conform to the topography of the unetched silicon surface 108 and the trench 101. In an embodiment of the instant invention, a CVD oxide is used for the fill material 103. For this embodiment, an optional densification of the fill material 103 is performed by annealing the oxide in the temperature range of 500C to 1500C in an ambient comprising oxygen, nitrogen, argon or any combination thereof.

Figure 2A:
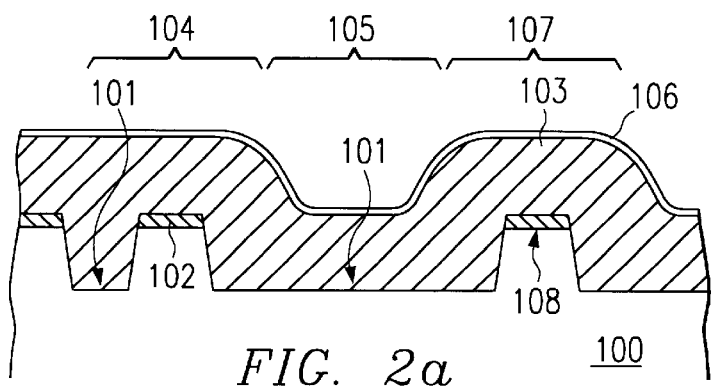
FIGS. 2A–2E are cross-sectional diagrams illustrating one embodiment of the instant invention.
Figure 2B:
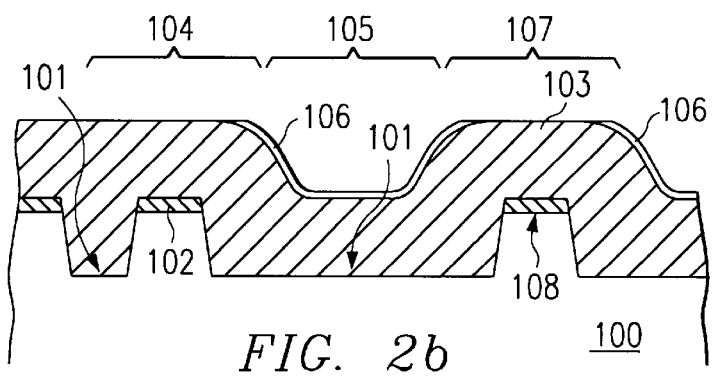
Figure 3:
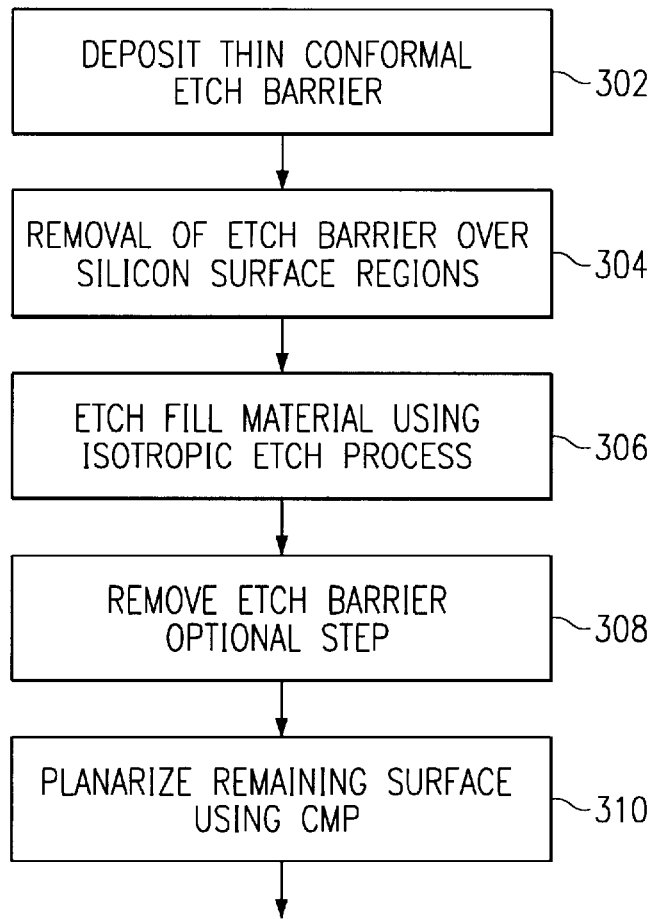
FIG. 3 is a flow chart illustrating the method of one embodiment of the instant invention.

In step 302 of FIG. 3, a thin conformal etch barrier that is resistant to the isotropic etchants of the fill material 103 is formed on the surface of the fill material 103. Such a thin conformal etch barrier 106 is shown in FIG. 2(a). In an embodiment of the instant invention, for fill material 103 comprising silicon dioxide, the etch barrier 106 is comprised of a 50A–4000A film of silicon nitride, polycrystalline silicon, amorphous silicon, metals, a polymer (such as paralene™) or any combination thereof. In step 304, the etch barrier 106 above the silicon surface 104, 107 is removed using CMP or other suitable techniques. The resulting structure is shown in FIG. 2B. It is desirable that only a minimum amount of material 103 underlying the etch barrier 106 be removed during this step. Typical selectivities for CMP slurries are 1:1 for nitride and oxide respectively, and 10:1 for polysilicon and oxide respectively.

Figure 2C:
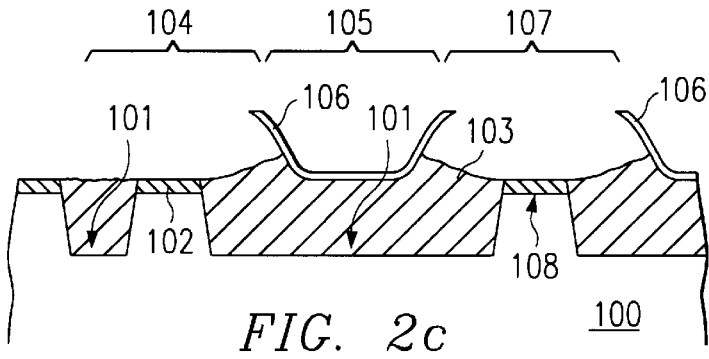

In step 306, the fill material 103 is isotropically etched. In alternate embodiments of the instant invention, portions of layer 103 may be isotropically removed by a wet chemical etch or a dry plasma-based etch or any combination thereof. Shown in FIG. 2C is the structure after the isotropic etch. In one embodiment of the instant invention with CVD silicon oxide fill material 103 and a silicon nitride or polycrystalline silicon etch barrier 106, a dilute HF solution (buffered or unbuffered) can be used as the etchant. The upper and lower limits of the HF concentration will depend on reaction rates at the lower concentration range and the isotropicity of the etchant to the fill materal at the upper concentration range. A practical concentration range for HF dilution is 0.25% to 15%, although the concentration is not limited to this range. In an alternative embodiment, a plasma-based etch can be used to perform the isotropic etch if CVD silicon oxide fill material 103 and silicon nitride or polysilicon etch barriers 106 are used. In this case the etch can be performed with plasma etchants using a florocarbon based chemistry (such as $CHF_2/CF_4/Ar$, $C_2F_6$, $C_3F_8$, or $CHF_3$).

Figure 2D:
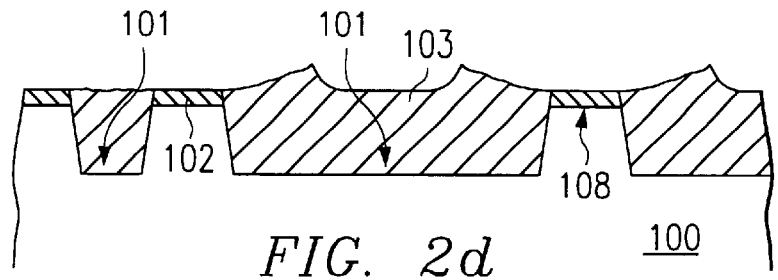

Step 308 is an optional step and involves removing the remaining etch barrier 106 using either a wet chemical etch or a plasma-based etch. If step 308 is not performed, the remaining portions of structure 106 will be removed in CMP step 310. However, this may cause scratching or contamination. In an embodiment with CVD silicon oxide fill material and a polysilicon etch barrier, hot phosphoric acid would be a suitable wet chemical etchant. In both cases the etching process should remove the etch barrier without removing a significant amount of the fill material. The resulting structure if this step is performed is shown in FIG. 2D.

Figure 2E:
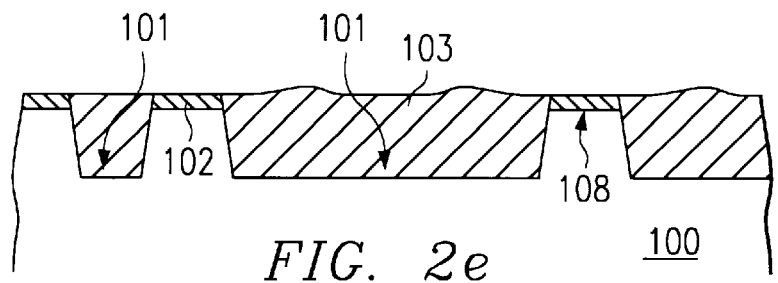

In step 310, the remaining wafer surface is planarized using CMP to remove remaining fill material covering the silicon surface 108. The resulting structure is shown in FIG. 2E. The integrated circuit can then be completed using standard processing techniques.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of forming isolation structures in a semiconductor substrate, said method comprising the steps of:

etching trenches in said substrate, thereby forming substantially unetched areas of said substrate between said trenches;

depositing a conformal fill material that substantially fills said trenches, said fill material having an upper surface;

forming a conformal etch barrier on said upper surface of said conformal fill material;

removing portions of said conformal etch barrier situated over said substantially unetched areas of said substrate thereby exposing portions of said conformal fill material;

removing said exposed portions of said conformal fill material using an isotropic etch; and polishing said conformal fill material using chemical mechanical polishing.

2. The method of claim 1, further comprising the step of removing said conformal etch barrier using a selective etch process, whereby said selective etch process has a conformal etch barrier etch rate that is greater than a conformal fill material etch rate.

3. The method of claim 1, wherein said conformal fill material comprises a material selected from the group consisting of: silicon oxide and silicon oxynitride.

4. The method of claim 1 wherein said conformal etch barrier comprises a material selected from the group consisting of: silicon nitride, polycrystalline silicon, and amorphous silicon.

5. The method of claim 1 wherein said conformal etch barrier comprises a metal.

6. The method of claim 1 wherein said conformal etch barrier comprises a polymer.

7. The method of claim 1 wherein said removing portions of said conformal etch barrier situated over said substantially unetched areas of said substrate comprises chemical mechanical polishing.

8. The method of claim 1 wherein said removing portions of said conformal etch barrier situated over said substantially unetched areas of said substrate comprises a dry plasma etch.

9. The method of claim 1 wherein said removing portions of said conformal etch barrier situated over said substantially unetched areas of said substrate comprises wet chemical etching.

10. The method of claim 1, wherein said removing said exposed portions of said conformal fill material comprises a wet chemical isotropic etch.

11. The method of claim 1, wherein said removing said exposed portions of said conformal fill material comprises a dry plasma isotropic etch.

12. A method of forming isolation structures in a semiconductor substrate, said method comprising the steps of:

etching trenches in said substrate, thereby forming substantially unetched areas of said substrate between said trenches;

depositing a fill material that substantially fills said trenches, said fill material having an upper surface;

forming a etch barrier on said upper surface of said fill material;

removing portions of said etch barrier situated over said substantially unetched areas of said substrate thereby exposing portions of said fill material;

removing said exposed portions of said fill material; and planarizing said fill material.

13. The method of claim 12, further comprising the step of removing said etch barrier using a selective etch process, whereby said selective etch process has a etch barrier etch rate that is greater than a fill material etch rate.

14. The method of claim 12, wherein said fill material comprises a material selected from the group consisting of: silicon oxide and silicon oxynitride.

15. The method of claim 12 wherein said etch barrier comprises a material selected from the group consisting of: silicon nitride, polycrystalline silicon, and amorphous silicon.

16. The method of claim 12 wherein said etch barrier comprises a metal.

17. The method of claim 12 wherein said etch barrier comprises a polymer.

18. The method of claim 12 wherein said removing portions of said etch barrier situated over said substantially unetched areas of said substrate comprises chemical mechanical polishing.

19. The method of claim 12 wherein said removing portions of said etch barrier situated over said substantially unetched areas of said substrate comprises a dry plasma etch.

20. The method of claim 12 wherein said removing portions of said etch barrier situated over said substantially unetched areas of said substrate comprises wet chemical etching.

21. The method of claim 12, wherein said removing said exposed portions of said fill material comprises a wet chemical isotropic etch.

22. The method of claim 12, wherein said removing said exposed portions of said fill material comprises a dry plasma isotropic etch.

23. The method of claim 12, wherein said planarization of said fill material comprises chemical mechanical polishing.

24. A method of forming isolation structures in a semiconductor substrate, said method comprising the steps of:

etching trenches in said substrate, thereby forming substantially unetched areas of said substrate between said trenches;

depositing a conformal fill material that substantially fills said trenches, said fill material having an upper surface, elevated areas, and depressed areas;

forming a conformal etch barrier on said upper surface of said conformal fill material;

removing portions of conformal etch barrier in said elevated areas thereby leaving it in said depressed areas thereby exposing portions of said conformal fill material;

removing said exposed portions of said conformal fill material using an isotropic etch; and polishing said conformal fill material using chemical mechanical polishing.

25. The method of claim 24, further comprising the step of removing said conformal etch barrier using a selective etch process, whereby said selective etch process has a conformal etch barrier etch rate that is greater than a conformal fill material etch rate.

26. The method of claim 24, wherein said conformal fill material comprises a material selected from the group consisting of: silicon oxide and silicon oxynitride.

27. The method of claim 24 wherein said conformal etch barrier comprises a material selected from the group consisting of: silicon nitride, polycrystalline silicon, and amorphous silicon.

28. The method of claim 24 wherein said conformal etch barrier comprises a metal.

29. The method of claim 24 wherein said conformal etch barrier comprises a polymer.

30. The method of claim 24 wherein said removing portions of conformal etch barrier in said elevated areas comprises chemical mechanical polishing.

31. The method of claim 24 wherein said removing portions of conformal etch barrier in said elevated areas comprises a dry plasma etch.

32. The method of claim 24 wherein said removing portions of conformal etch barrier in said elevated areas comprises wet chemical etching.

33. The method of claim 24, wherein said removing said exposed portions of said conformal fill material comprises a wet chemical isotropic etch.

34. The method of claim 24, wherein said removing said exposed portions of said conformal fill material comprises a dry plasma isotropic etch.

* * * * *